United States Patent [19]

Cheon et al.

[11] Patent Number: 5,043,819
[45] Date of Patent: Aug. 27, 1991

[54] CCD SOLID STATE IMAGE SENSOR WITH TWO HORIZONTAL TRANSFER CCDS CORRESPONDING TO BOTH ODD AND EVEN COLUMNS OF ELEMENTS

[75] Inventors: Insang Cheon, Suwon; Beomsik Kim, Seoul, both of Rep. of Korea

[73] Assignee: Samsung Electronics Co., Ltd., Suwon, Rep. of Korea

[21] Appl. No.: 446,236

[22] Filed: Dec. 5, 1989

[51] Int. Cl.$^5$ .................. H04N 3/14; H04N 5/335; H01L 29/78
[52] U.S. Cl. .................. 358/213.23; 358/213.29; 357/24
[58] Field of Search .................. 358/213.23, 213.29; 357/24

[56] References Cited

U.S. PATENT DOCUMENTS

| | | | |
|---|---|---|---|
| 4,712,137 | 12/1987 | Kadekodi et al. | 358/213.29 |
| 4,743,778 | 5/1988 | Takatsu et al. | 358/213.19 |
| 4,819,072 | 4/1989 | Boucharlat et al. | 358/213.29 |

Primary Examiner—James J. Groody
Assistant Examiner—Wendy R. Greening
Attorney, Agent, or Firm—Kenyon & Kenyon

[57] ABSTRACT

A CCD solid state image sensor has first and second horizontal transfer CCDs located at the upper and lower sides, respectively, of a sensing element array. Two polysilicon electrodes are located in each row of the array, a first polysilicon electrode being arranged in an up position in even-numbered columns and in a down position in odd-numbered columns, and a second polysilicon electrode being arranged in a down position in even-numbered columns and in an up position in odd-numbered columns. These electrodes form vertical transfer channels. Signal changes in the vertical transfer channels corresponding to even-numbered columns are shifted in the upward direction and the signal changes in the vertical transfer channels corresponding to the odd-numbered columns are shifted in the downward direction, onto the first and second horizontal transfer CCDs, respectively. Thus the need for a transfer electrode between the horizontal CCDs is eliminated, creating a two-level electrode structure.

2 Claims, 1 Drawing Sheet

CCD SOLID STATE IMAGE SENSOR WITH TWO HORIZONTAL TRANSFER CCDS CORRESPONDING TO BOTH ODD AND EVEN COLUMNS OF ELEMENTS

BACKGROUND OF THE INVENTION

The present invention relates to CCD (charge-coupled-device) solid state image sensors in general, and in particular to CCD image sensors with two horizontal transfer CCDs, one of which is located at the upper side of a sensing element array and the other is located at the lower side of the sensing element array. Two polysilicon electrodes are located in each row of the array, arranged in an up position in even columns and in a down position in odd columns, while the other is arranged in an up position in odd columns and in a down position in even columns.

In CCD solid state image sensors of the prior art, attempts have been made to achieve a higher packing density of sensing elements in order to provide a high-definition picture. However, in such devices, which employ horizontal transfer CCDs with a higher driving frequency, the driving circuit is insufficient, reducing the transfer efficiency of the image sensor. Therefore, it is necessary to provide two horizontal transfer CCDs below the vertical transfer channels.

The configuration of a CCD image sensor of the prior art is shown in a plan view in FIG. 1. In this Figure, a multiplicity of photo-sensors 1 acting as light sensing elements are arranged in a multiplicity of columns and rows, and a multiplicity of vertical transfer channels 8 acting as transfer elements are positioned between columns of the photosensors 1.

Signal charges are produced at the light-sensing elements by a photoelectric process as a result of exposure to light from an image.

The signal charges produced in each sensing element are simultaneously transferred to the adjacent transfer channels 8 during the vertical scanning period at the standard television rate. The vertical transfer channels 8 comprise polysilicon electrodes 2 and 3. A predetermined clock pulse is applied as a driving pulse to the electrodes 2 and 3 to move the signal charges formed in the sensing elements one row at a time in the downward direction onto first and second horizontal CCDs 5 and 6. The transferred signal charges are then transmitted in sequence from the first and second horizontal CCDs 5 and 6 to the first and second output terminals, respectively, through each amplifier 7.

However, such a solid state image sensor of the prior art requires a third polysilicon electrode 4 in order to transfer the signal charges between the horizontal CCDs 5 and 6. The need for the three polysilicon electrodes 2 and 3 and 4 arranged in a three-level structure creates a disadvantage because the manufacturing process is complicated. An additional disadvantage of this prior art sensor is that it requires separate driving pulses in order to drive the transfer electrode 4.

Thus there is a need for a CCD image sensor which can be manufactured by a simple process and which requires fewer driving pulses.

SUMMARY OF THE INVENTION

The present invention describes a simple, more easily manufactured CCD solid state image sensor, comprising first and second horizontal transfer CCDs located at an upper and lower side, respectively, of a sensing element array. Two polysilicon electrodes are located in each row of the array, a first polysilicon electrode being in an up position in even-numbered columns and in a down position in odd-numbered columns and a second polysilicon electrode being in a down position in even-numbered columns and in an up position in odd-numbered columns. Although physically disposed horizontally in rows, these electrodes effectively form vertical transfer channels. The signal charges in the transfer channels corresponding to even-numbered columns are shifted in the upward direction, while the signal charges in the transfer channels corresponding to the odd-numbered columns are shifted in the downward direction, onto the first and second horizontal transfer CCDs, respectively.

DETAILED DESCRIPTION

Figure 1:
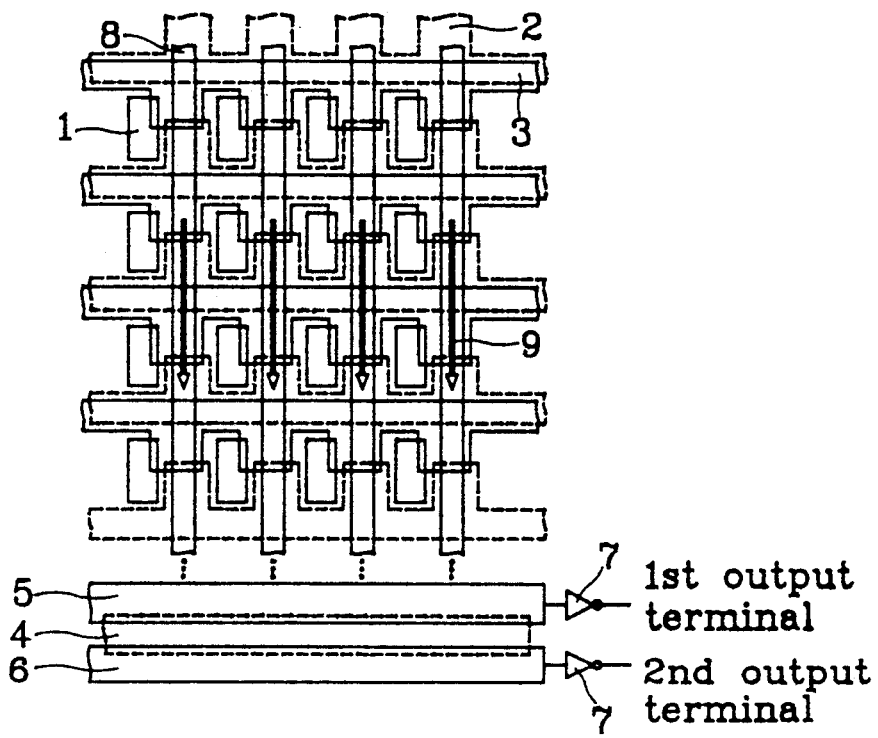
FIG. 1 is a plan view of a CCD solid state image sensor of the prior art.
Figure 2:
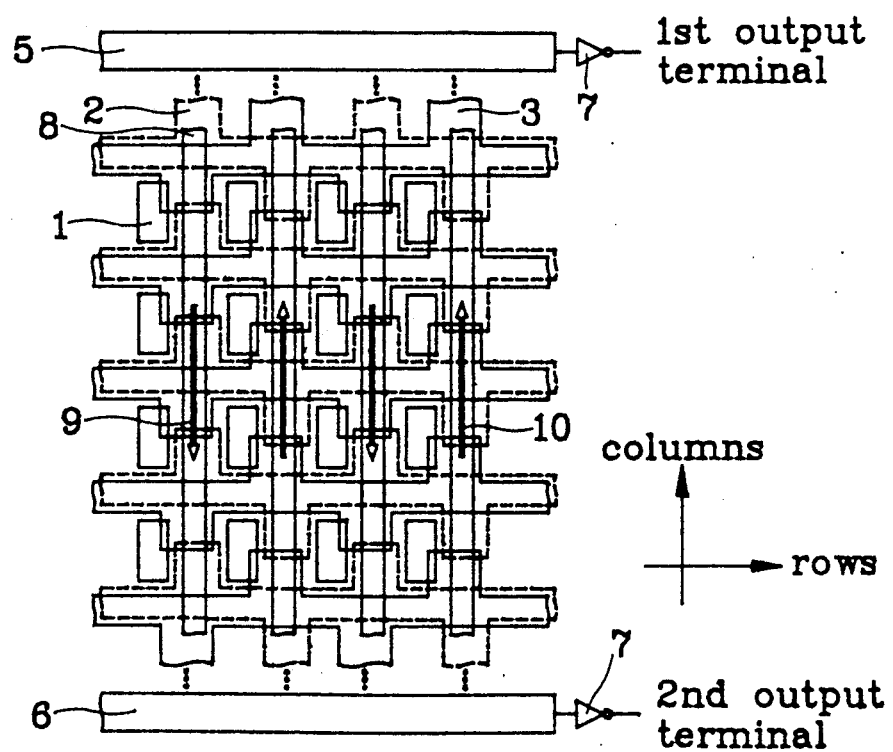
FIG. 2 is a plan view of a CCD solid state image sensor of the present invention.

The overall configuration of the CCD solid state image sensor of the present invention is shown in FIG. 2. The image sensor comprises two horizontal transfer CCDs 5 and 6 which are located at the upper and lower sides, respectively, of the sensing element array.

Two polysilicon electrodes 2 and 3 are located in each row of the array, a first polysilicon electrode 3 being arranged in an up position in even-numbered columns and in a down position in odd-numbered columns, and a second polysilicon electrode 2 being arranged in a down position in even-numbered columns and in an up position in odd-numbered columns. These electrodes form vertical transfer channels. A predetermined clock pulse is applied as a driving pulse to the electrodes 2 and 3.

As a result of this arrangement, the signal charges in the vertical transfer channels 8 corresponding to even-numbered columns are shifted in the upward direction 10 onto the first horizontal transfer CCD 5, and the signal charges in the vertical transfer channels 8 corresponding to odd-numbered columns are shifted in the downward direction 9 onto the second horizontal transfer CCD 6.

Therefore, the signal charges in the vertical transfer channels 8 at each of the even and odd-numbered rows can be transferred up and down the channels 8 to the horizontal transfer CCDs 5 and 6 by means of the same driving pulse that is applied to the first and second polysilicon electrodes 2 and 3, without the need for a third polysilicon electrode 4 to transfer the signal charges between the horizontal CCDs.

Therefore, this CCD image sensor eliminates the need for a transfer electrode between the horizontal CCDs, thus creating a two-level electrode structure with a single driving pulse.

Consequently, the present invention advantageously simplifies the manufacturing process and results in higher productivity. Furthermore, since the driving pulse for the transfer electrode between the horizontal CCDs is no longer necessary, the driving circuits have been simplified.

We claim:

1. A CCD solid state image sensor comprising: an array of sensing elements arranged in a multiplicity of rows and columns; a first and second horizontal transfer CCD located at upper and lower sides, respectively, of the sensing element array; and two electrodes located in each row of the array, a first electrode being arranged in an up position in even-numbered columns and in a down position in odd-numbered columns, and a second electrode being arranged in a down position in even-numbered columns and in an up position in odd-numbered columns, the electrodes forming a corresponding multiplicity of vertical transfer channels, the vertical transfer channels adapted to transfer signal charges, the signal charges shifting in the upward direction onto a first horizontal transfer CCD in the vertical transfer channels corresponding to even-numbered columns and shifting in the downward direction onto a second horizontal transfer CCD in the vertical transfer channels corresponding to the odd-numbered columns.

2. The CCD solid state image sensor as in claim 1, further comprising a multiplicity of amplifiers coupled to the first and second horizontal transfer CCDs.

* * * * *